United States Patent [19]
Chennakeshu et al.

[11] Patent Number: 5,905,742
[45] Date of Patent: May 18, 1999

[54] METHOD AND APPARAUTS FOR SYMBOL DECODING

[75] Inventors: Sandeep Chennakeshu; Ravinder David Koilpillai, both of Cary, N.C.; John B. Anderson, Latham, N.Y.

[73] Assignee: Ericsson Inc., Research Triangle Park, N.C.

[21] Appl. No.: 08/579,349

[22] Filed: Dec. 27, 1995

[51] Int. Cl.⁶ ........................................... G06F 11/10
[52] U.S. Cl. ..................... 371/43.4; 371/43.5; 371/43.6; 371/43.7; 371/43.8; 375/222; 375/261; 375/263; 375/341
[58] Field of Search ........................... 371/43, 43.4, 43.7, 371/30, 46, 37.9, 43.1, 43.5, 43.6, 43.8, 42, 41, 43.2, 37.8; 375/222, 341, 261.3

[56] References Cited

U.S. PATENT DOCUMENTS

| | | | |
|---|---|---|---|
| 5,020,056 | 5/1991 | Chennakeshu | 370/347 |
| 5,151,926 | 9/1992 | Chennakeshu et al. | 375/333 |
| 5,177,740 | 1/1993 | Toy et al. | 370/337 |
| 5,202,901 | 4/1993 | Chennakeshu et al. | 375/331 |
| 5,249,205 | 9/1993 | Chennakeshu et al. | 375/348 |
| 5,274,629 | 12/1993 | Helard et al. | 370/50 |
| 5,283,811 | 2/1994 | Chennakeshu et al. | 375/233 |
| 5,283,815 | 2/1994 | Chennakeshu et al. | 375/330 |
| 5,311,552 | 5/1994 | Chennakeshu et al. | 375/265 |
| 5,311,553 | 5/1994 | Chennakeshu et al. | 375/265 |

(List continued on next page.)

FOREIGN PATENT DOCUMENTS

| | | |
|---|---|---|
| 0 441 731 | 8/1991 | European Pat. Off. . |
| 0 441 731 A1 | 8/1991 | European Pat. Off. . |
| 0 443 997 | 8/1991 | European Pat. Off. . |
| 0 443 997 A1 | 8/1991 | European Pat. Off. . |
| 0 457 460 | 11/1991 | European Pat. Off. . |
| 0 457 460 A2 | 11/1991 | European Pat. Off. . |
| 0 496 152 | 7/1992 | European Pat. Off. . |
| 0 496 152 A2 | 7/1992 | European Pat. Off. . |
| 0 496 152 A3 | 7/1992 | European Pat. Off. . |
| 0 691 770 | 1/1996 | European Pat. Off. . |
| 0 691 770 A2 | 1/1996 | European Pat. Off. . |

OTHER PUBLICATIONS

*IEEE Transactions on Consumer Electronics*, Feb. 1995, USA, vol. 41, No. 1, ISSN 0098–3063, pp. 150–159, XP000529220, Wen–Ta Lee et al., "A single–chip Viterbi decoder for a binary convolutinal code using an adaptive algorithm".

VTC 1994, "Creating Tommorrow's Mobile Systems, 1994 IEEE 44th Vehicular Technology Conference (CAT. No. 94CH3438–9), Proceedings of IEEE Vehicular Technology Conference (VTC), Stockholm, Sweeden, 8–10 Jun. 1994, ISBN 0–7803–1927–3, 1994, New York, NY, USA, IEEE, USA, pp. 1237–1240, vol. 2 XP000497617, K.C. Change et al.," An adaptive reduced–state channel equalizer with T–algorithm.

(List continued on next page.)

*Primary Examiner*—Reba I. Elmore
*Assistant Examiner*—McDieunel Marc
*Attorney, Agent, or Firm*—Nixon & Vanderhye P.C.

[57] ABSTRACT

A low complexity, high performance trellis decoder adapts the complexity of the trellis decoding process based on a current condition of the communications system. A trellis structure of nodes and branches is developed to decode the sequence of symbols received over a communications channel. Each set of nodes in the trellis represents the possible values of a received symbol at one time instant. Each branch defines a specific transition between nodes at different time instants, and each branch has an associated branch metric or weight. A linkage of branches between the nodes and the trellis defines a path through the trellis that represents one possible symbol sequence, and an accumulated metric/weight is generated for each possible path through the trellis. A variable number M survivor paths through the trellis is determined based on their accumulated path metric/weights. The value of the variable M depends on the current condition of the communications system. Once the value of M is adapted to the current condition, the sequence of received symbols is decoded using M survivor paths through the trellis.

47 Claims, 7 Drawing Sheets

U.S. PATENT DOCUMENTS

| | | | |
|---|---|---|---|
| 5,349,589 | 9/1994 | Chennakeshu et al. | 371/43.7 |
| 5,351,274 | 9/1994 | Chennakeshu et al. | 375/347 |
| 5,363,407 | 11/1994 | Ramesh et al. | 375/254 |
| 5,371,471 | 12/1994 | Chennakeshu et al. | 329/304 |
| 5,400,362 | 3/1995 | Chennakeshu et al. | 375/285 |
| 5,406,593 | 4/1995 | Chennakeshu et al. | 375/376 |
| 5,541,955 | 7/1996 | Jacobsmeyer | 375/222 |
| 5,586,128 | 12/1996 | Chen | 371/43 |

OTHER PUBLICATIONS

*Journal of The Institution of Electronic and Radio Engineers,* May 1986, UK, vol. 56, No. 5, ISSN 0267–1689, pp. 197–206, XP002018516, S.B. Aftelak et al., "Adaptive reduced–state Viterbi algorithm detector".

*IEEE Transactions on Communications,* Jan. 1990, USA, vol. 38, No. 1, ISSN 0090–6778, pp. 3–12, XP000102576, S.J.Simmons, "Breadth–first trellis decoding with adpative effort".

*IEEE Transactions on Information Theory,* Sep. 1989, USA vol. 35, No. 5, ISSN 0018–9448, pp. 944–955, XP000100926, J.B. Anderson, "Limited search trellis decoding of convolutional codes".

*IEEE Transactions on Communications,* Feb. 1984, USA, vol. COM–32, No. 2, ISSN 0090–6778, pp. 169–176, XP00218512, J.B. Anderson et al., "Sequential coding algorithms: a survey and cot analysis".

*IEEE Proceedings—Communications,* Jun. 1994, UK, vol. 141, No. 3, ISSN 1350–2425, pp. 168–176, XP000438038, G. Benelli et al., "Some digital receivers for the GSM pa–European cellular communication system".

*IEEE Transaction on Vehicular Technology,* Feb. 1994, USA, vol. 43, No. 1, No.1, ISSN 0018–9545, pp. 57–68, XP000450947, R.V. Cox et al., "An efficient adaptive circular Viterbi algorithm for decoding generalized tailbiting convolutional codes".

*44th Vehicular Technology Conference,* Vol. 2, Jun. 8–10, 1994, Stockholm, Sweeden, R. Toy et al., "Performance of a Spectrally Efficient Modem for Land–Mobile Radio".

*GE Research & Development Center,* Technical Information Series, Signals and Systems Laboratory, 93CRD069, May 1993, R. Toy et al., "An Envelope–Constrained TCM Modem for Digital Land–Mobile Radio".

McLane et al., "Convolutinally Interleaved PSK and DPSK Trellis Codes for Shadowed, Fast Fading", IEEE pp. 438–444, 1988.

METHOD AND APPARAUTS FOR SYMBOL DECODING

The present invention relates to decoding received symbols in a communications system, and in particular, describes a decoding technique using a trellis structure where the number of trellis states or paths retained during the decoding process is variable.

BACKGROUND AND SUMMARY OF THE INVENTION

In coded data communications, encoded symbols are transmitted over a communications channel, (e.g., a radio frequency communications channel), which is subject to various types of distortion such as co-channel and adjacent channel interference, noise, dispersion, fading, weak signal strength, etc. Trellis coding is one technique used to encode sequences of symbols to be transmitted, and in the process, introduces memory to the transmitted signal. Because of the introduced memory, the transmitted signal at any instant of time depends on previously transmitted signals. Therefore, in order to demodulate the received signal and recover the transmitted symbols, the decoding process must be performed taking into account the whole sequence of symbols.

The preferred method of symbol sequence decoding is maximum likelihood sequence estimation (MLSE) which offers a mechanism for decoding the transmitted signal optimally in the sense of minimizing the probability of error. In the MLSE method, the received sequence of signals is compared with every possible sequence of symbols that could have been transmitted. The particular sequence out of all of the possible sequences that best matches the received sequence of signals is chosen as the decoded sequence. If the length of the transmitted symbol sequence is N symbols long and there are Q possible values that each symbol can take, then the MLSE pattern matching scheme tries to determine the best match from among $Q^N$ possible sequences. However, even for modest values of Q and N, the number of potential MLSE search sequences is too complex for implementation.

Figure 1:
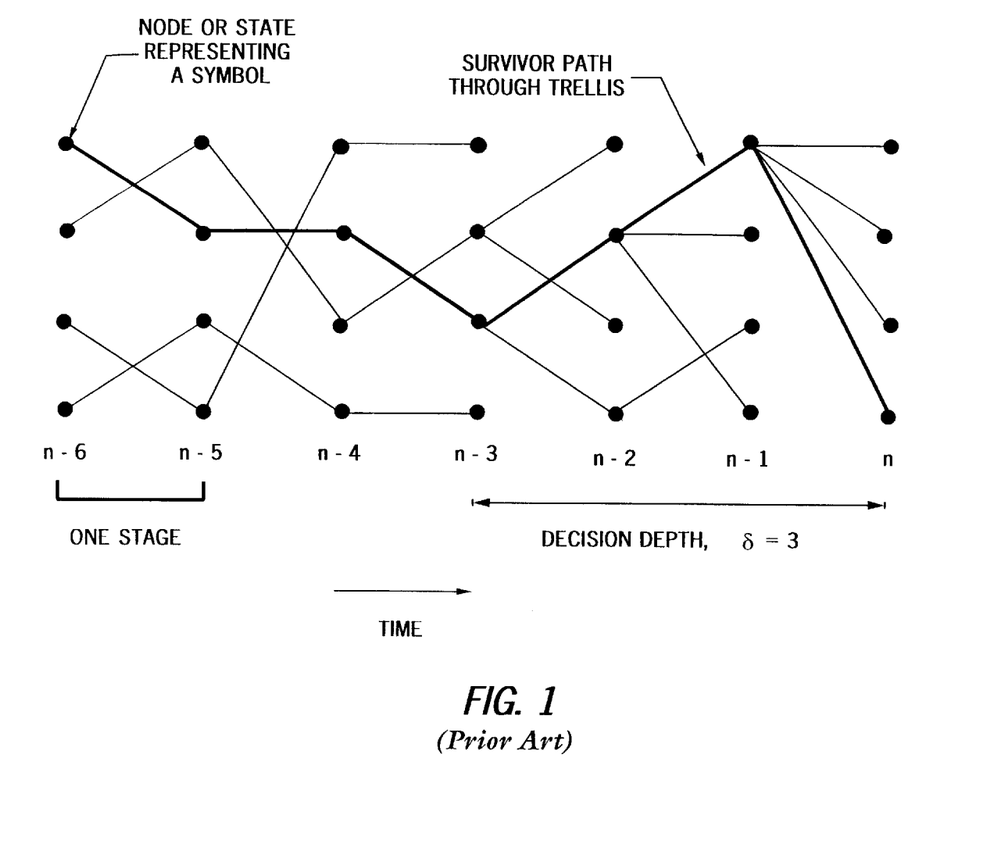
FIG. 1 is a graphical illustration of a trellis.

One simplified solution for performing the MLSE search is provided by the well known Viterbi algorithm. To understand the Viterbi algorithm, the search problem is represented as a method of searching a trellis. FIG. 1 illustrates a simple trellis where each transmitted symbol can take one of four values. Each trellis node corresponds to one value of the transmitted symbol and is often referred to as a state. At each time instant/stage, in the trellis there are four nodes defining a four-state trellis. The set of nodes repeats for each transmitted symbol period. Transitions between nodes are called branches, and each branch is associated with a possible symbol that could have been transmitted. This structure of nodes (states) and branches (symbols) defines the trellis.

A metric or weight is formed for each branch which indicates the likelihood of the symbol corresponding to that branch being part of the true received symbol sequence. An example of a metric is the squared, absolute difference between a received signal sample and a corresponding estimate of the sample formed using the symbol associated with that branch. This metric is referred to as the squared Euclidean distance metric. A linkage of branches through the nodes forms a path. The path with the best accumulated metric (i.e., the smallest sum of the branch metrics) is chosen, and the symbols corresponding to the branches of the chosen path are output as the decoded symbols.

To streamline the search procedure, the Viterbi algorithm retains only the branch into each node/state having the best/optimal (i.e., lowest) metric and discards the remaining branches into that node/state. This best branch selection procedure significantly reduces the number of possible paths through the trellis. Then, from those possible paths, the Viterbi algorithm selects the path through the trellis that produces the minimum overall distance. Since it is only necessary to retain as many paths as there are nodes, i.e., there is only one path per state, the paths that remain at each state/node are called "survivors". The Viterbi algorithm is a recursive technique that traces an optimal path of survivors through the trellis.

The main problem with the Viterbi algorithm is that its complexity grows exponentially with the number of states (memory) of the transmitted, trellis-coded signal. With the number of states being expressed as $Q^N$ and with Q as the number of possible values a symbol can take, N represents the memory or dependence of a symbol on other symbols. A "memory of N" implies that each symbol depends on N other symbols, e.g., previous symbols. This complexity can be reduced using what is known as the M-algorithm or T-algorithm, both of which further restrict the number of states retained for decoding. In the basic M-algorithm, for each time instant in the trellis, the number of survivors is restricted to a fixed integer number M. The M-algorithm chooses the M most likely states based on the accumulated path metrics. The survivor states having larger accumulated path metrics are discarded. Another variant of the M-algorithm is to retain the best (as defined by the accumulated path metrics) M-paths through the trellis rather than M states. Hence, the M-algorithm restricts the search through the trellis to a fixed number of states M at any time instant in the trellis. Unfortunately, if the selected value for M is too small, there is a high probability of retaining the wrong M states for decoding which results in a high error probability. On the other hand, if the selected value of M is too large, the decoding procedure becomes unduly complex.

The T-algorithm retains only those states which have an associated metric that is below a predetermined threshold (T). Like the M-algorithm, the choice of the fixed threshold T is critical in order to achieve satisfactory performance without undue complexity. In practice, the selection of a threshold T for a particular communications application that is suitable for all or most conditions encountered in that application is quite difficult.

The problem with a fixed M or a fixed T is that the communications channel, over which encoded symbols are transmitted, received, and then decoded, changes. In radio frequency communications, the radio channels exhibit constantly changing parameters because of fading, multipath dispersion, adjacent channel interference, co-channel interference, noise, etc. In order to compensate for worst case scenarios for a communications channel, the value of M for the M-algorithm or the value of T for the T-algorithm must be set to a relatively large number in order to have a sufficient number of states available to satisfactorily decode the symbols under such worst case channel conditions. However, this is an inefficient decoding approach because for a large percentage of the time, the channel condition may be quite good, and a much smaller number of states is all that is needed to satisfactorily decode the received signal.

What is needed therefore is a trellis decoding procedure with reduced complexity that can adapt the number of survivor paths or states in the trellis based upon one or more conditions of the communications system. In radio communication applications, and especially battery operated, portable radios, transmit power is at a premium. However, lower transmit power may result in poor decoding performance at the receiver. There is also a need to reduce the transmit power of fixed transceivers like base station/repeaters to minimize adjacent channel interference. But this reduction is only feasible if receivers can accurately and efficiently decode the signals transmitted at lower power.

SUMMARY OF THE INVENTION

It is an object of the present invention to provide a trellis decoding method and apparatus with reduced complexity and high performance.

It is an object of the present invention to provide a trellis decoding method and apparatus with reduced complexity, low bit error rate, and reduced power requirements.

It is a further object to provide a reduced complexity trellis decoder and decoding procedure which adapts to a current condition of the communications system.

It is yet another object to improve the efficiency and effectiveness of trellis decoding procedures using antenna diversity, frequency hopping, and/or symbol interleaving.

The present invention provides low complexity, high performance trellis decoding that adapts trellis decoding complexity based on a current condition of the communications system. A trellis structure of nodes and branches is developed to decode the sequence of symbols received over a communications channel. Each set of nodes in the trellis represents all possible values of a received symbol at one time instant. Each branch defines a specific transition between nodes at different time instants, and each branch has an associated branch weight. A linkage of branches between the nodes and the trellis defines a path through the trellis that represents one possible symbol sequence, and an accumulated weight is generated for each possible path through the trellis. A variable number M of survivor paths (or states) through the trellis is determined based on these respective, accumulated path weights. The value of the variable M depends on the current condition of the communications system. Once the value of M is adapted to the current condition, the sequence of received symbols is trellis decoded using the M survivor paths/states.

A first value of M is selected if the current state of communications system condition is less than or equal to a threshold. Otherwise, a second value of M less than the first value of M is selected if the current status of the communications system condition is greater than the threshold. In one embodiment, the first value of M corresponds to a maximum value, and the second value corresponds to a minimum value. If after selecting the minimum value of M, the current communications system deteriorates to less than the threshold, the value of M is increased toward the maximum value in a controlled fashion. In particular, the received signal once again is trellis decoded using an increased value of M. On the other hand, when the value of M is at a maximum and the current communications system condition improves and now exceeds the threshold, the value of M is "pruned" or reduced in each successive stage of the trellis until it reaches the minimum value (assuming the current communications system condition continues to exceed the threshold).

One of the communications system conditions may be the quality of the communications channel. A minimum value of M is selected if the current quality of the channel is greater than the threshold, otherwise, a maximum value of M is selected. Alternatively, the communications system condition may relate to the complexity of the encoding scheme used to encode the symbols to be transmitted. For example, a more powerful coding scheme that has more encoding memory can be used to generate a coded signal. Although this typically involves decoding with a large value of M, such decoding may be performed in accordance with the present invention with a reduced number of states or paths, thereby minimizing decoding complexity.

Sometimes the trellis decoding procedures are performed using data processing circuitry and that data processing circuitry usually must perform a number of other tasks in a time share relationship, another communications system condition relates to the current data processing tasks to be performed by the data processing circuitry. The value of M is decreased if the current number of additional tasks to be performed is relatively large. In this way, the data processing circuitry is relieved of the burden of a complex decoding process so that it may devote more processing resources to perform the other pending tasks. On the other hand, the value of M can be increased, thereby improving the performance of the decoder, if the current number of additional pending tasks is relatively small.

When decoder performance is of primary concern, the value of M can be varied to maintain a predetermined level of decoder performance in response to changes in the quality of the communications channel. When M is relatively low, fill data processing capacity is not consumed by the operation of the trellis decoder. As a result, the excess data processing capacity may be devoted to other tasks having lower priority. In the context of portable, battery-operated radios, the value of M may be decreased whenever consistent with decoder performance objectives in order to reduce the number of data processing tasks associated with the trellis decoding operation, and thereby, reduce battery drain.

The present invention may also be applied to a spread spectrum type receiver in which plural encoded sequences of symbols transmitted by plural transmitters are received on a single communications channel. The value of M may be changed in response to changes in the number of interfering signals. When satisfactory performance of the decoder is degraded because of additional interfering signals, the value of M may be increased to maintain or improve decoder performance. On the other hand, when the number of interfering signals decreases, the value of M may be decreased to a smaller value of M which is still consistent with satisfactory decoder performance in order to conserve processor or battery resources.

In one specific example embodiment, the present invention adapts the trellis decoding complexity based on a current channel condition in a communications system using a best received signal from plural diversity antennas. Each of the receiver's plural diversity antennas receives a transmitted signal made up of a sequence of coded symbols. A received signal from one of the plural antennas having the highest signal quality is selected by the receiver and then decoded using a trellis decoding procedure which employs a variable number M of trellis survivor paths or states, where M depends on the quality of the received signal. By selecting the antenna producing a received signal with the highest signal quality, the variable number M is reduced to a greater extent than it otherwise would be if a weaker, lower quality signal received by another of the antennas were used. As an alternative to selecting the received signal from only one of the plural diversity antennas, another embodiment of the present invention selectively weights and then combines the weighted signals from the plural antennas to generate a combined signal. The received signal from one of the antennas having the highest signal quality is most heavily weighted in the combined signal.

In general, the variable number M is varied as a function of the current quality of the communications channel. In a receiver using diversity antennas, signals received from each of the plural diversity antennas are detected and stored, and a channel quality indicator is determined for each stored signal. The stored signal having the highest channel quality indicator is selected, and the value of the variable M is determined based on that highest channel quality indicator. The stored, received signal is then decoded using that recently determined number of trellis survivor paths or states. More specifically, if the highest channel quality indicator is greater than a threshold, the value of M is decreased. On the other hand, if the highest channel quality indicator is less than that threshold, the value of M is increased. Signal quality of each received signal is determined based on received signal strength, and in one example preferred embodiment, is based on an average faded signal amplitude of the received signal.

In essence, the value of M is adapted with the channel condition as reflected in the received channel quality indicator. The value of M is increased when the channel condition is poor, and the value of M is decreased when the channel condition is good. The complexity of the variable-M decoding procedure is proportional to the ratio of time during which the channel condition is good relative to when the channel condition is poor. The present invention improves this ratio using antenna diversity, and as a result, lowers the transmit power required to achieve a given bit error rate by the receiver decoder relative to use of the same variable M decoding procedure without antenna diversity. Lowering transmit power reduces battery drain for transmitting portable radio transceivers and reduces adjacent channel interference caused by transmitters in fixed, base station type transceivers. For a given transmit power, the present invention reduces decoding complexity, and therefore reduces battery drain by the receiver, or improves decoding performance in terms of reducing the number of bit errors without increasing battery drain by the receiver.

Similar to the diversity antenna selection example described above, the present invention may also be advantageously applied to a symbol interleaving and/or frequency hopping communications system. Both symbol interleaving and frequency hopping improve the quality of received signals which permits the use of a smaller value of M in accordance with the invention. These and other features and advantages of the present invention will become apparent from the following description of the drawings and from the claims.

DETAILED DESCRIPTION OF THE DRAWINGS

In the following description, for purposes of explanation and not limitation, specific details are set forth, such as particular circuit arrangements, techniques, etc. and in order to provide a thorough understanding of the present invention. However, it will be apparent to one skilled in the art that the present invention may be practiced in other embodiments that depart from these specific details. In other instances, detailed description of well-known methods, devices, and circuits are omitted so as not to obscure the description of the present invention with unnecessary detail.

Figure 2A:
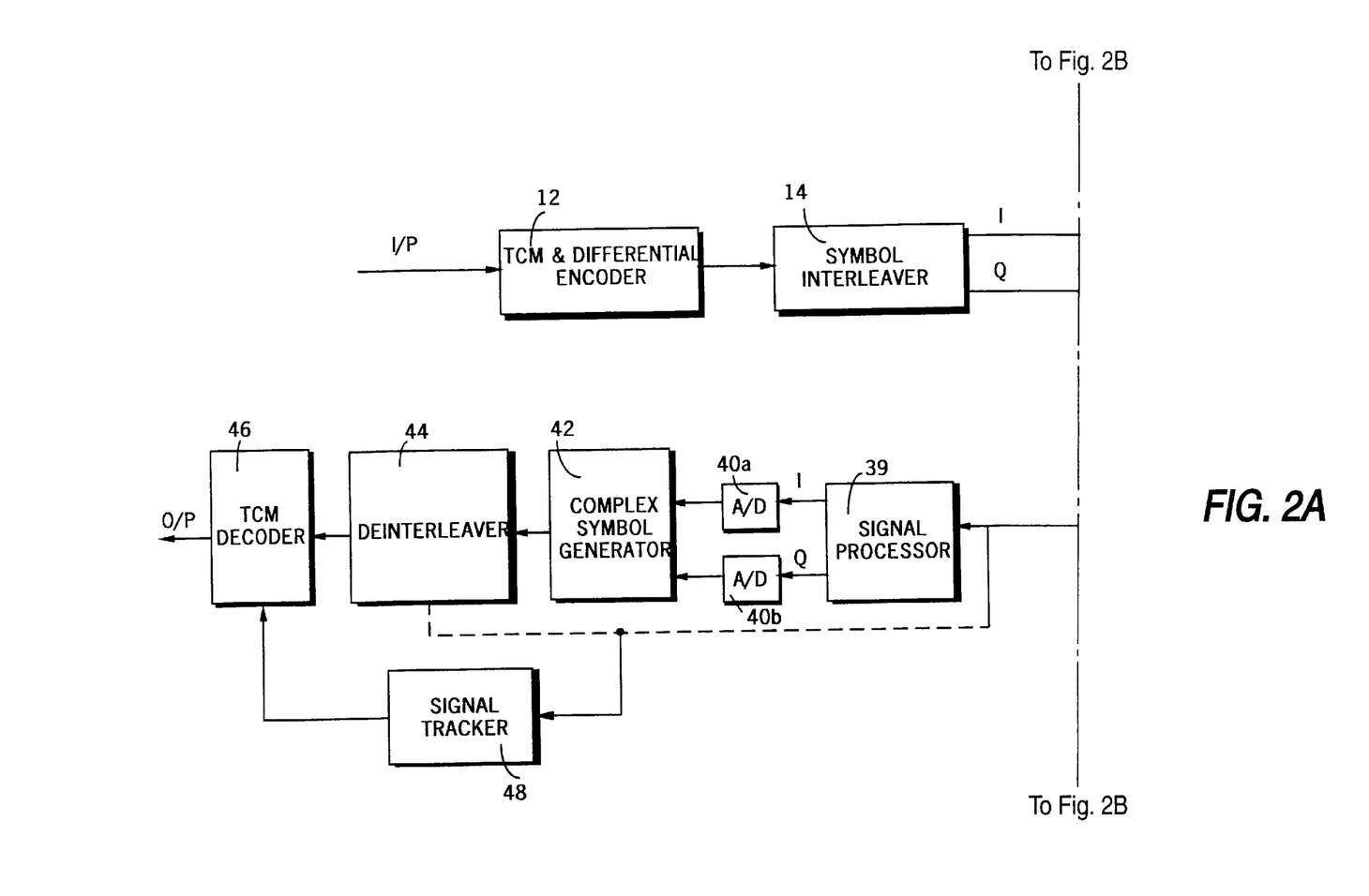
FIG. 2 is a function block diagram of one example communications system in which the present invention may be employed.
Figure 2B:
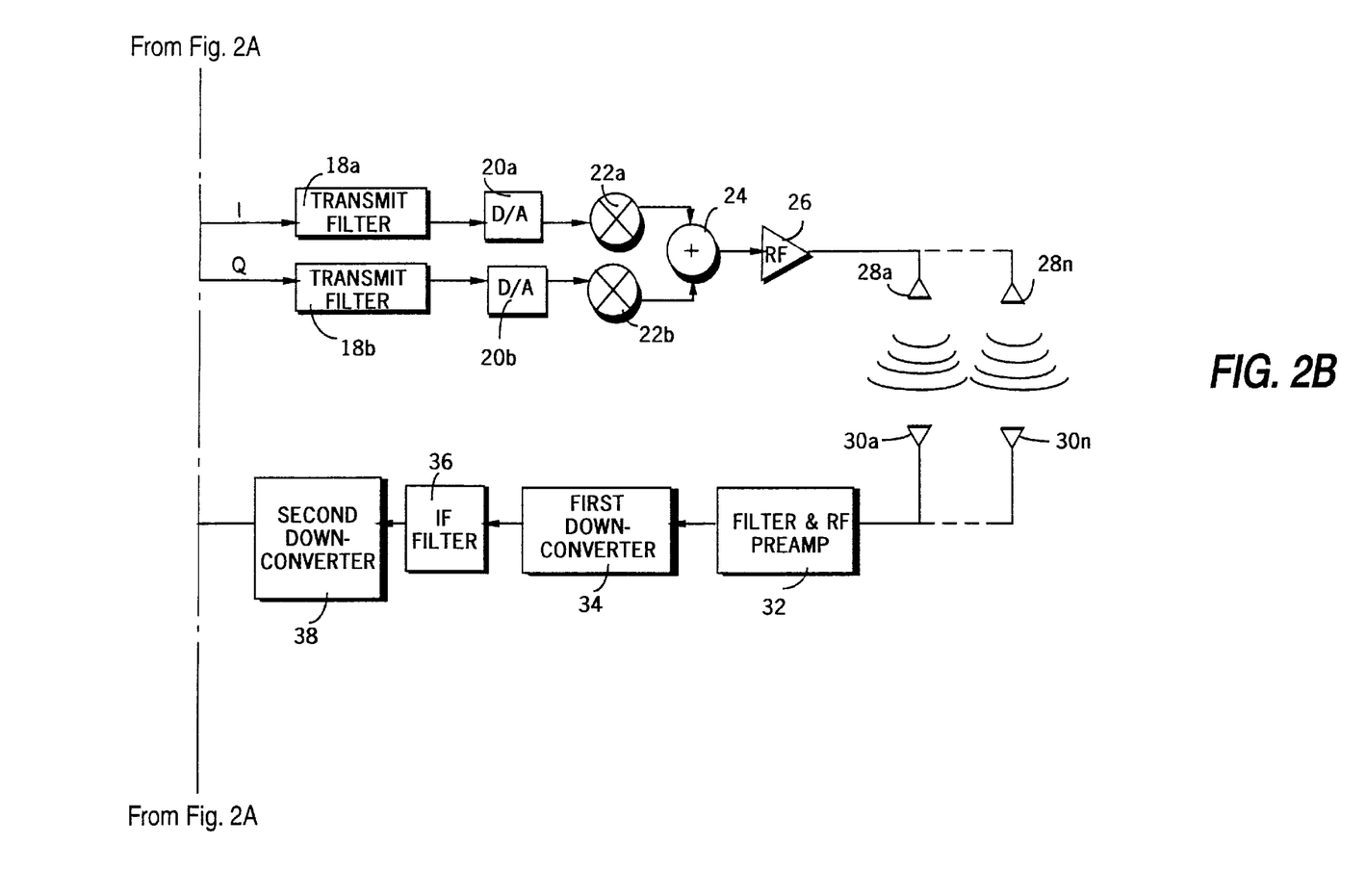

Referring to FIG. 2, an overall function block diagram of an example communications system 10 which may employ the present invention is shown. While the present invention is particularly well suited to radio communications including both fixed and portable radios, it is applicable to other communications environments as well.

On the transmit side, the information signal to be transmitted, i.e., a sequence of symbols, is encoded by a trellis code modulation (TCM) and differential encoder 12. If the encoded symbols are being transmitted on a slotted communications channel, for example, using well-known time division multiplex (TDM) techniques, a symbol interleaver 14 is desirable (although not necessary) to break up or "shuffle" symbol sequence segments into different time slots. Interleaving is particularly effective in communication channels subject to fading because symbol segments received under poor channel conditions are interspersed with symbol segments received under good channel conditions. The symbols may be complex and are represented by two components, namely a real value I (in-phase) and an imaginary value Q (quadrature). The in-phase and quadrature components are passed through parallel processing branches. Each component is passed through a transmit filter 18a, 18b, converted in digital-to-analog (D/A) converters 20a, 20b, and frequency shifted by quadrature modulators 22a, 22b. The quadrature modulated signals are then mixed in summer 24 and sent to an RF amplifier 26 which increases the gain of the signal. The RF amplifier 26 passes the amplified signal to one or more antennas 28a . . . 28n for transmission. Conventional frequency hopping techniques may be used to "hop" between multiple carrier frequencies with each frequency carrying only a portion of the symbols.

One or more antennas 30A . . . 30N at the receiver side of the communications system 10 receive the signal. In a receive antenna diversity application, diversity antennas 30A . . . 30N may be incorporated in fixed radio transceivers such as base station transceivers/repeaters and in portable/mobile radios. The received signals from each of the plural diversity antennas 30A . . . 30N are processed using respective radio amplification and downconversion paths. However, for simplicity, only a single downconversion path is illustrated and described in FIG. 2.

One antenna signal (or a combination of signals from the diversity antennas) passes through a filtering and RF preamplifier stage 32 to a first downconverter 34 which reduces the frequency (or frequencies in a frequency hopping system) of the received signal to an intermediate frequency. The intermediate frequency signal is passed through an intermediate frequency receive filter 36, then through a second downconverter 38 to produce a (low pass) filtered baseband signal. Although the IF downconversion is desirable, it is of course not necessary to implement the present invention. The filtered baseband signal is then converted into a complex signal having in-phase (I) and quadrature (Q) components by signal processor 39. The in-phase and quadrature signals are digitized by analog-to-digital (A/D) converters 40a, 40b and passed through complex signal generator 42 which converts differential phase information into a sequence of symbols. Deinterleaver 44 reconstitutes interleaved slots of information (i.e., it performs the reverse shuffling operation to undo the shuffling operation performed by interleaver 14). TCM decoder 46 processes this symbol stream using a trellis decoding technique described in further detail below to recover the transmitted signal information. Signal tracker 48 estimates an average faded signal strength of an analog signal output from the IF stage 38 or from samples of the received signal from the deinterleaver 44. In a preferred embodiment, deinterleaver 44, TCM decoder 46, and signal tracker 48 are implemented using a suitably programmed microprocessor and/or digital signal processing circuitry.

The TCM decoder 46 is a maximum likelihood sequence estimation (MLSE) trellis decoder that develops a trellis of nodes and branches (similar to that shown in FIG. 1 and described in the background of the invention) for decoding sequences of symbols received on the communications channel. Each set of nodes in the trellis represents all possible values of a received symbol at one time instant. Transition between a node or state at one time instant to a node or state at another time instant is referred to as one stage of the trellis. Each stage typically includes branches with each branch defining a specific transition between nodes at sequential time instances, and each branch has an associated branch weight or metric. Only the "survivor" branch into each node having the best (smallest) metric is retained. A linkage of branches between nodes over multiple stages in the trellis defines a path through the trellis that represents a possible received symbol sequence. For each possible trellis path, the branch metrics associated with that path are accumulated or summed to provide a path metric. The path having the lowest accumulated metric is selected as the best path.

The present invention determines which of the survivor paths is through the trellis will be maintained for purposes of decoding based on a current condition of the communications system. The other remaining survivor paths are discarded to simplify the decoding operation. In other words, a variable number of M survivor paths upon which trellis decoding of the received sequence of symbols is based depends on a current condition of the communications system.

Figure 3:
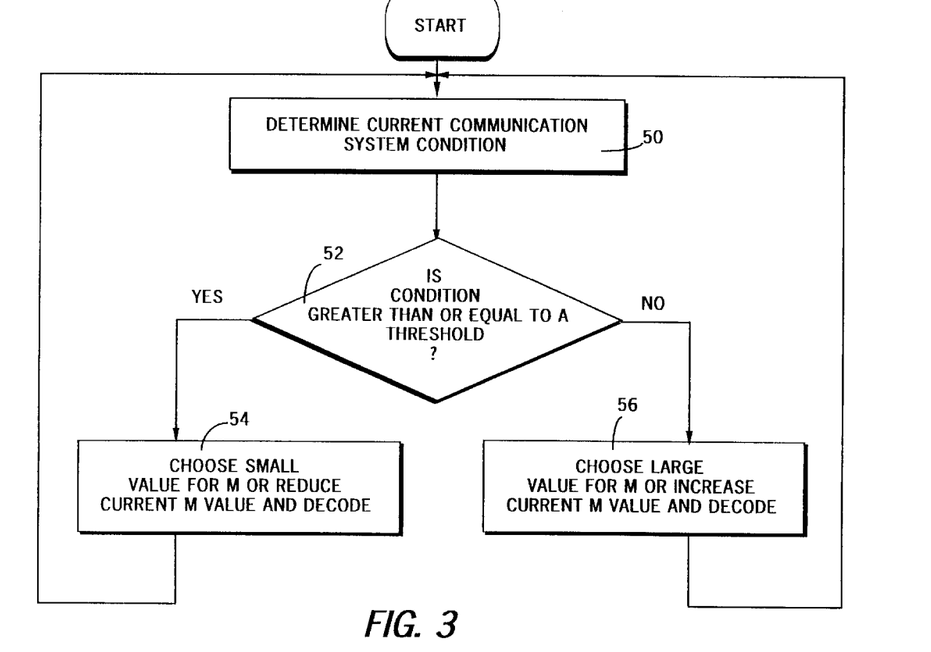
FIG. 3 is a flowchart diagram outlining basic procedures for implementing the variable stage trellis decoding algorithm in accordance with the present invention.

FIG. 3 outlines in flowchart form the general procedures for varying the number of M survivor paths to be used in the trellis decoding. The current communications system condition is determined in step 50. Various examples of different communications system conditions will be described in further detail below. In decision block 52, a decision is made whether the current communications system condition is greater than or equal to a predetermined threshold. If it is, a lower or small value of M is selected, or alternatively, the current M value is reduced (block 54). Otherwise, a larger (or large) value of M is selected, or alternatively, the current value of M is increased (block 56). Once the current value of M is determined, trellis decoding using, for example, the well-known Viterbi algorithm is performed to determine the best estimate of the received symbol sequence. In essence, if the current communications system condition is determined to be sufficiently optimal, which is determined in this example by comparison with a threshold, the number of states or paths needed to satisfactorily (in terms of low bit error rates) decode the received symbol sequence is relatively small. On the other hand, if the current communications system condition is less than the threshold, a larger number of M is used to ensure satisfactory decoding performance.

One example of a useful communications system parameter is the quality of the communications channel. As already described above, the quality of any communications channel varies over time to some degree. In radio communications in particular, the quality of the communications channel changes rapidly (especially when the radio user is moving in a car) with the communications channel being subjected to fading, multipath dispersion, adjacent channel interference and co-channel interference from other users, noise, and other channel impairments. In this situation, the current quality of the communications channel is detected or determined signal tracker 48. If the current quality of the channel is greater than the threshold, meaning that the channel quality is good, a first relatively small value of M is selected. Alternatively, if the current quality of the channel is less than a threshold value, indicating poor channel quality, another relatively large value of M is selected greater than the value of M selected if the channel quality is good. In practice, there are minimum ($M_{min}$) and maximum ($M_{max}$) limits on the value of M selected depending upon the particular application.

Channel quality can be measured using a number of conventional channel quality indicators such as received signal strength, signal-to-noise ratio (SNR), signal to interference ratio (SIR), bit error rate (BER), etc. One preferred example indicator is averaged faded signal strength (AFSS) which is a smoothed estimate of the channel amplitude of the received signal which may be obtained using a channel tracking algorithm. Preferably, the channel tracking algorithm low-pass filters received signal samples to provide an estimate of the envelope of the amplitude of the received signal. More specifically, in a differentially encoded Phase Shift Keying (PSK) system, s(n), $c_n$, and η(n) represent a (complex baseband) transmitted symbol, a complex channel gain, and additive Gaussian noise, respectively, at time n. If y(n) is the received signal, and r(n) is the signal at the output of the complex symbol generator 42, then y(n) and r(n) may be expressed as follows:

$$y(n) = c_n s(n) + \eta_n \quad (1)$$

$$r(n) = y(n)y^*(n-1) = [c_n s(n) + \eta_n][c_{n-1}s(n-1) + \eta_{n-1}]^*, \quad (2)$$

$$= \underbrace{c_n c_{n-1}^*}_{a_n} s(n)s^*(n-1) +$$

$$\underbrace{\frac{c_{n-1}^* s^*(n-1)\eta(n) + c_n s(n)\eta^*(n-1) + \eta_n \eta_{n-1}^*}{\eta_n'}}$$

$$r(n) = a_n e^{j\Delta\phi_n} + \eta_n', \quad (3)$$

where $\Delta\phi_n$ is the differential phase angle at time n (satisfying the relation s(n)=s(n−1) $e^{j\Delta\phi_n}$), and $a_n = c_n c^*_{n-1} \simeq |c_n|^2$ is a measure of the energy of the faded signal. In a fading channel, the channel gain $c_n$ varies with time. The AFSS algorithm obtains the average fade signal strength $\hat{a}_n$ (an averaged value of $a_n$), and tracks its variation over time by executing the following equations:

$$\Delta\hat{\phi}_n = \min_k |r(n) - \hat{a}_{n-1} e^{j\Delta\phi k}|^2, \quad (4)$$

$k = 0, 1, \ldots$ (all possible transmitted phase angles)

$$a'_n = \text{Real}\,[r(n)e^{-j\Delta\hat{\phi}_n}] \quad (5)$$

$$\hat{a}_n = \gamma \hat{a}_{n-1} + (1-\gamma) a'_n \quad (6)$$

where $\gamma$ is a real number in the range (0,1). The value of $\gamma$ controls the extent of smoothing (to minimize the effect of noise). A typical value is $\gamma=0.8$.

Figure 4:
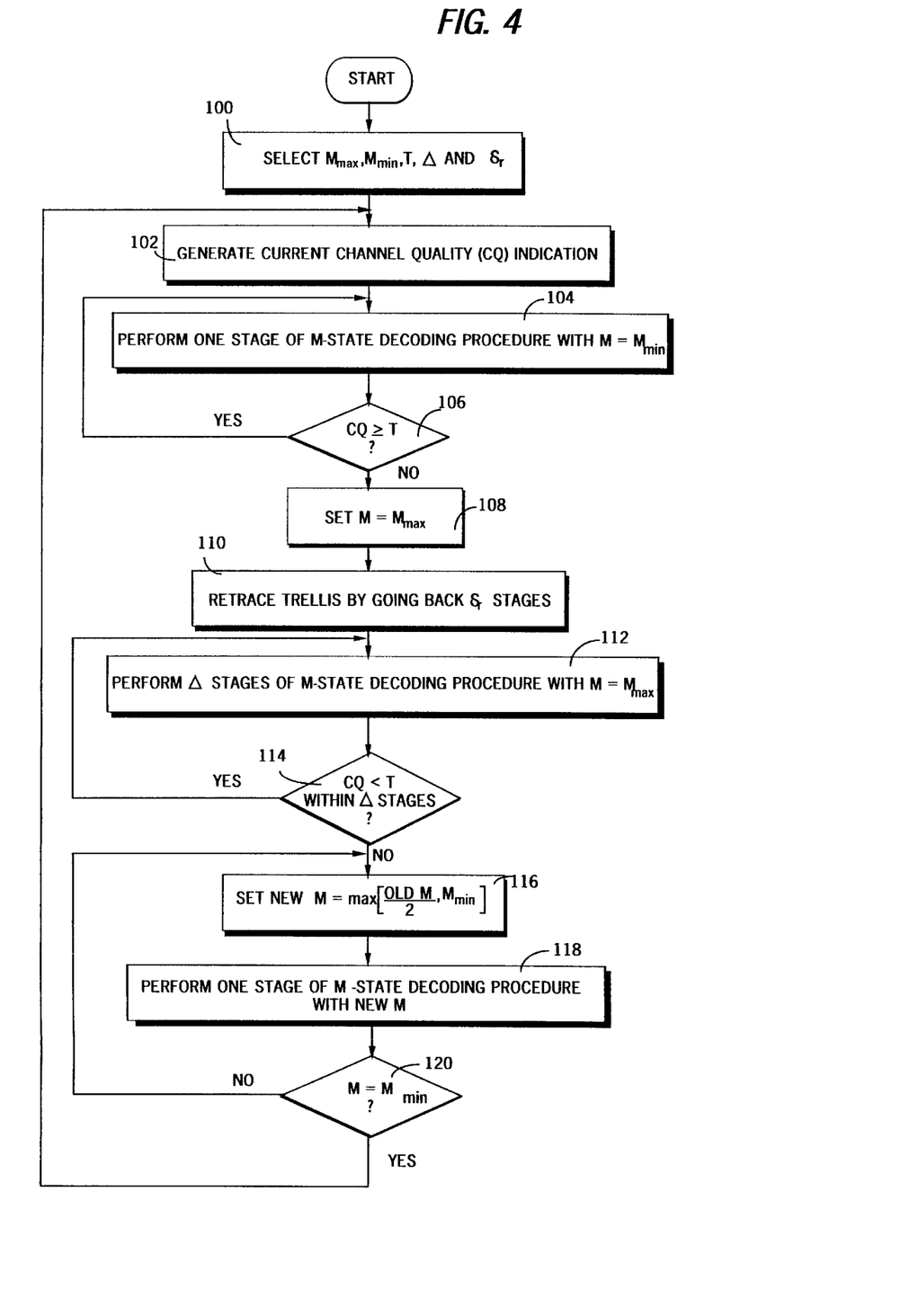
FIG. 4 is a flowchart diagram outlining specific procedures for implementing a specific example embodiment of the variable stage trellis decoding algorithm where the communications system parameter is current communications channel quality.

FIG. 4 illustrates in flowchart diagram format one preferred example embodiment for implementing the present invention where the communications system parameter is channel quality. Initialization procedures are performed in block 100 to select $M_{min}$, $M_{max}$, the channel quality threshold value T, a poor channel holding window $\Delta$, and a retrace stage depth $\delta_r$. The initialization parameters $M_{min}$, $M_{max}$, T, $\Delta$, and $\delta_r$ are chosen depending upon the particular communications application and can often be effectively determined using simulation tests. The current channel quality is determined in block 102 using for example an AFSS procedure as described above. One stage of the M state trellis decoding procedure is performed following the well-known Viterbi decoding procedures to M set equal to $M_{min}$ (block 104). A decision is made in block 106 whether the current channel quality is greater than or equal to the channel quality threshold T. If it is, the decoding procedure is continued with M set to its minimum value $M_{min}$ thereby reducing the complexity of the trellis decoding operation. However, if the current channel quality is less than the channel quality threshold T, the value of M is set to its maximum value $M_{max}$ (block 108).

Rather than continuing on in the trellis decoding operation assuming that the just recently decoded stages of the trellis were accurately decoded, the present invention takes into account the fact that these just recently decoded stages of the trellis were likely to have been adversely impacted by the newly detected poor channel quality. Therefore, the decoding operation is repeated for a number $\delta_r$ of last stages by retracing that number $\delta_r$ of stages in the trellis and restarting the trellis decoding algorithm (block 110). This retrace procedure ensures a high degree of reliability in decoding accuracy.

Control proceeds to block 112, where A stages of the M-sized trellis decoding algorithm are performed with M set equal to $M_{max}$. Another decision is made at block 114 to determine whether the current channel quality is less than the threshold T within the $\Delta$ stages. If it is, the M state decoding procedure is continued at block 112 with M set at $M_{max}$. However, if the current channel quality is greater than or equal to the threshold T, a new, smaller value of M is generated in block 116 reflecting the current trend that reduced decoding complexity may be appropriate in view of the recently improved channel quality. But rather than immediately setting the new value of M to $M_{min}$, the present invention employs a more conservative "pruning" procedure. Namely, the value of M is halved in each successive stage of the trellis until it reaches $M_{min}$. Thus, when the channel improves, the present invention employs the poor channel holding window $\Delta$ and the controlled M-reduction or pruning procedure to ensure that the channel condition remains at the improved level before M is set to $M_{min}$. The M state decoding procedure is performed with the new smaller value of M in block 118 being reduced again, if possible, in block 116 until it reaches $M_{min}$ (block 120). Control returns to block 102 to repeat the above-described operation recursively decoding received symbols at the lowest, optimal level of decoding complexity to ensure satisfactory decoding performance.

Figure 5:
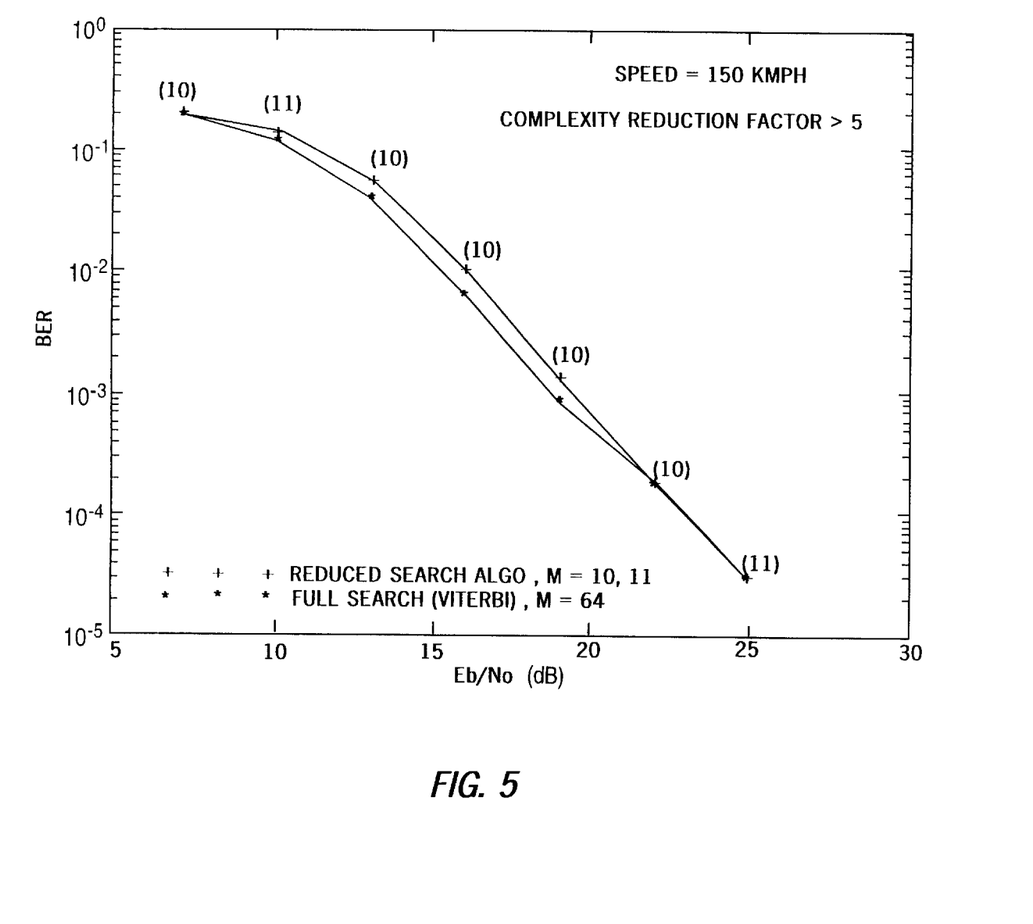
FIG. 5 is a graph illustrating the performance of the reduced complexity trellis decoding procedure in accordance with the present invention as compared with the traditional, higher complexity Viterbi trellis decoding procedure.

FIG. 5 illustrates the performance of the present invention with reduced complexity as compared to the traditional full complexity Viterbi algorithm. Bit error rate (BER) is applied on the vertical axis with the signal-to-noise ratio (Eb/No [energy per bit to noise power spectral density]) plotted in dB on the horizontal axis. In this practical illustration, the radio receiver is moving in a vehicle at a speed of 150 KMPH. The full Viterbi search corresponds to a 64-state (M=64) demodulation scheme (indicated by asterisks), while the graph of the decoding scheme in accordance with the present invention uses a variable M (indicated by plus signs). Virtually the same decoding performance was achieved by both procedures. However, the present invention accomplished this decoding using an average of 10 and 11 states (M=10–11) as compared to the full 64-state Viterbi algorithm. Thus, the complexity of the variable M algorithm employed by the present invention was six times less complex when measured in terms of number of operations executed to decode the data.

Other example embodiments using different communications system conditions are now described. For example, the communications system condition may relate to the complexity of the encoding scheme used by the transmitter TCM encoder 12. Codes with more memory potential (sometimes referred to as "constraint length" in the literature) exhibit better performance. However, since decoding complexity increases exponentially with memory of the code, these codes cannot be easily used due to data processing constraints. A smaller value of M may be varied in this instance to adapt the decoding procedure to a level best suited given a particular set of codes.

Decoding procedures are performed using data processing circuitry, and oftentimes the data processing circuitry must perform a number of other tasks in a time share relationship. Another communications system condition relates therefore to the current data processing tasks to be performed by the data processing circuitry. The value of M is decreased if the current number of additional tasks to he performed is relatively large. In this way, the data processing circuitry is relieved of the burden of a complex decoding process so that it may devote more processing resources to perform the other large number of pending tasks. On the other hand, the value of M can be increased, thereby improving the performance of the decoder, if the current number of additional pending tasks is relatively small.

When decoder performance is of primary concern, the value of M can be varied to maintain a predetermined level of decoder performance in response to changes in the quality of the communications channel. When M is relatively low, the fill capacity of the data processing circuitry is not consumed by the operation of the trellis decoder. As a result, the excess capacity of the data processing circuitry can be devoted to other tasks having lower priority. In the context of portable, battery-operated receivers, the value of M may be decreased whenever consistent with decoder performance objectives in order to reduce the number of data processing tasks associated with the trellis decoding operation, and thereby, reduce battery drain.

The present invention may also be applied to a spread spectrum type receiver in which plural encoded sequences of symbols transmitted by plural transmitters are received on a single communications channel. The value of M may be changed in response to changes in the number of interfering signals. When satisfactory performance of the decoder is degraded because of additional interfering signal, the value of M can be increased to maintain or improve decoder performance. On the other hand, when the number of interfering signals decreases, the value of M can be decreased to the smallest value of M consistent with satisfactory decoder performance in order to conserve processor or battery resources.

Another example embodiment of the present invention using diversity reception is now described in detail. As shown in FIG. 2, the receiver may have multiple antennas and obtain relatively uncorrelated copies of the received signal from each antenna. The antennas are rendered uncorrelated by separating them spatially or using orthogonal polarizations. The receiver combines these uncorrelated copies of the received signal in a manner to improve signal quality, i.e., selecting the strongest signal based on average faded signal strength, co-phasing the signals to perform maximal-ratio-combining or equal gain combining, adding the branch metrics calculated for each of the multiple antennas, and adding the received signals to suppress interference, etc. If there are N antennas and K interferers and K<N, then interference can be reduced. All these methods improve signal quality, allow the use of a small value of M, and reduce the variance of signal quality allowing using a smaller range of $M_{max}$, $M_{min}$.

Figure 6:
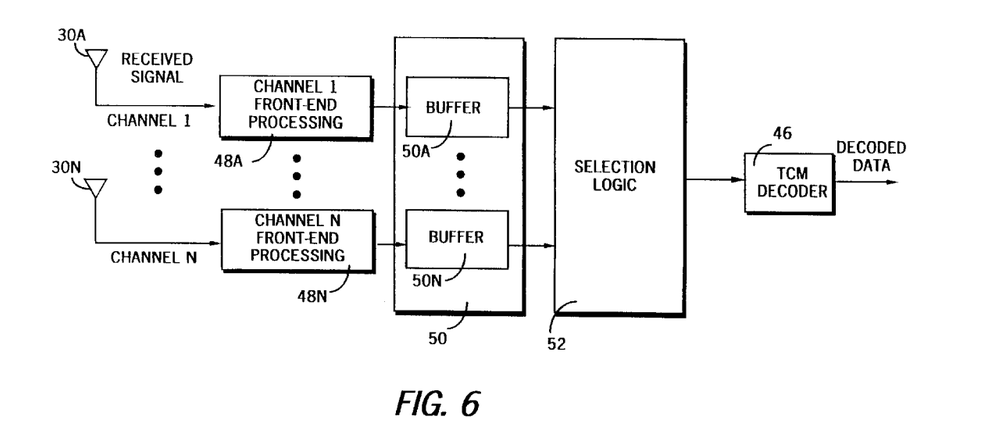
FIG. 6 is a more detailed function block diagram of the receiver branch shown in FIG. 2 in accordance with an example embodiment of the invention.

FIG. 6 is a function block diagram which shows in more detail the diversity antenna structure and one way of processing the signals received by each of the antennas in accordance with one example embodiment of the present invention. Signals received on each diversity antenna 30A . . . 30N are treated as a separate channel, i.e., channel 1 . . . channel N. Each channel is processed using its own dedicated front end processing circuitry 48A–48N which performs such conventional tasks as RF preamplification and frequency downconversion. Once the signals are converted to baseband, they are stored in a memory 50 which individually stores each baseband signal in a respective buffer 50A . . . 50N. Signal processor 39 in FIG. 2 includes selection logic 52 which determines a signal quality indicator for each buffered signal. The selection logic 52 then selects the buffered received signal having the highest signal quality indicator for farther processing and decoding in the TCM decoder 46. Alternatively, selection logic 52 may selectively weight the buffered signals based on their signal quality indicator and then combine the weighted signals into a combined signal. The buffered signal corresponding to the diversity antenna having the highest signal quality is most heavily weighted which ensures that the combined signal substantially reflects the best signal quality for that particular time instant.

Figure 7:
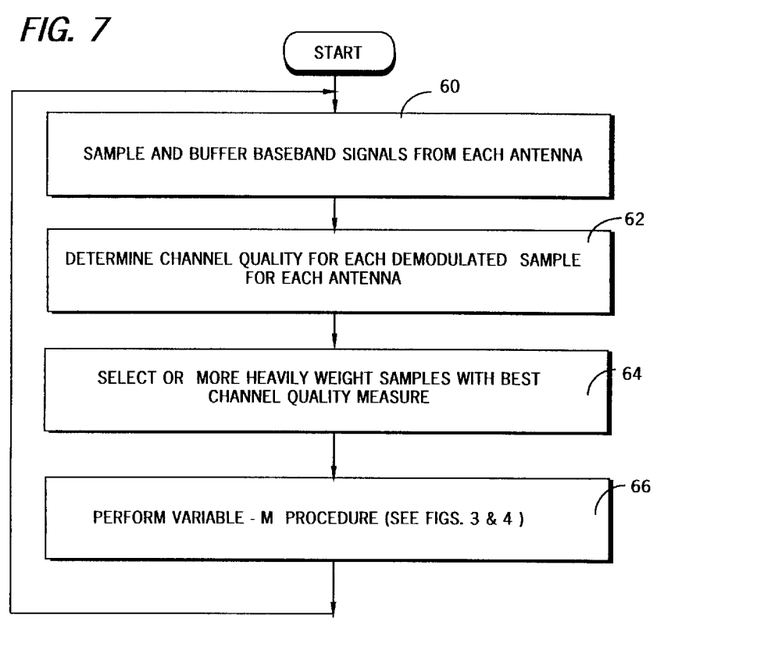
FIG. 7 is a flowchart diagram outlining the trellis decoding procedure using a variable number of M trellis states and antenna diversity in accordance with an example embodiment of the invention.

FIG. 7 outlines in flowchart form the general procedures for varying the number of M survivor paths to be used in the trellis decoding based on plural received signals by plural diversity antennas. The baseband signals from each diversity antenna are sampled and then buffered in step 60. The channel qualities for each demodulated sample corresponding to each of the plurality of diversity antennas are then determined in step 62. As described above, the buffered sample with the best channel quality measure is selected, or alternatively, more heavily weighted in step 64. A variable-M trellis decoding procedure is then performed in step 66 in accordance with the procedures outlined in the flowcharts illustrated in FIGS. 3 and 4 and described above.

Figure 8:
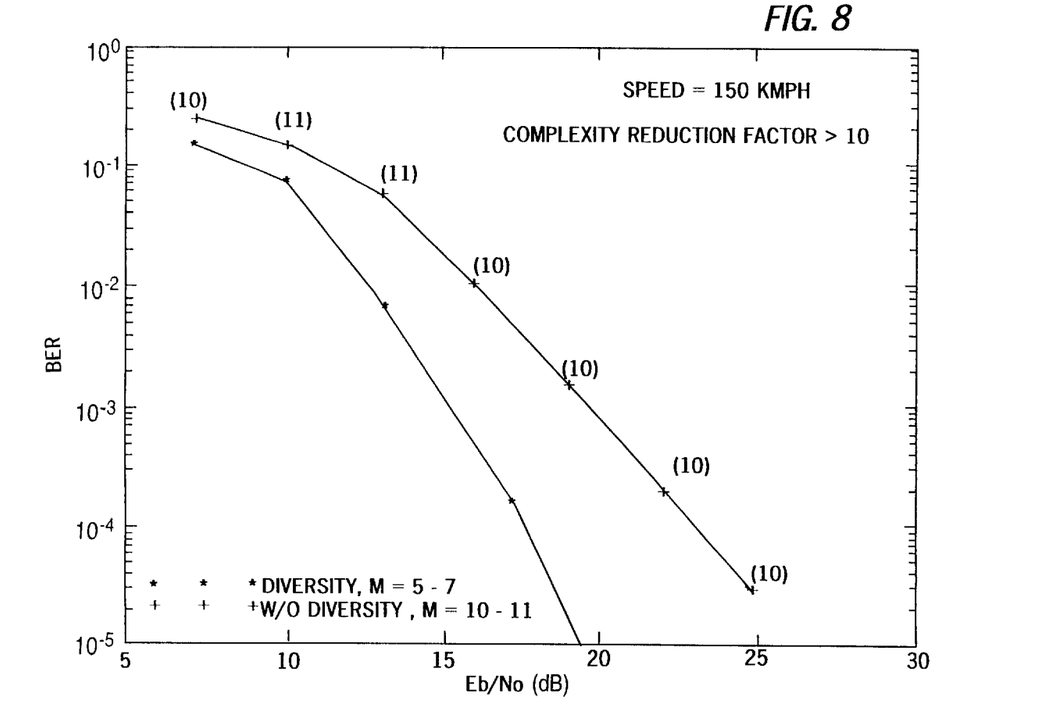
FIG. 8 is a graph illustrating the performance of the reduced complexity, variable-M trellis decoding procedure which incorporates antenna diversity in accordance with an example embodiment of the invention as compared to the variable-M trellis decoding procedure without antenna diversity.

Accordingly, even further reductions in complexity corresponding to an even further reduced value of M are achieved using diversity antenna reception in accordance with the present invention as described above. Again, bit error rate is plotted on the vertical axis of the graph with signal-to-noise ratio (Eb/No) plotted in dB on the horizontal axis. And again, the radio receiver is moving in a vehicle at a speed of 150 KMPH. The variable-M decoding scheme without diversity reception is plotted using plus signs. The plot of the variable-M decoding procedure using diversity reception (indicated by asterisks) reveals that using an average of 5 to 7 states (M=5–7), approximately an additional 50% reduction in decoding complexity is achieved. Moreover, relative to the full 64-state Viterbi algorithm, the variable-M decoding procedure with diversity reduces the decoding complexity by a factor of 11.

Thus, using diversity reception in conjunction with a variable-M decoding procedure, the present invention adapts the complexity of the trellis decoding procedure in accordance with the current channel conditions. This approach is not only more efficient in the sense of reduced decoding complexity, it also lowers the required transmitted power to achieve a fixed bit error rate performance. In essence, the value of M is adapted with the channel condition as reflected in the received channel quality indicator. The value of M is increased when the channel condition is poor, and the value of M is decreased when the channel condition is good. The complexity of the variable-M decoding procedure is proportional to the ratio of time during which the channel condition is good relative to when the channel condition is poor. The present invention improves this ratio using antenna diversity, and as a result, lowers the transmit power required to achieve a given bit error rate by the receiver decoder relative to use of the same variable M decoding procedure without antenna diversity. Lowering transmit power reduces battery drain for transmitting portable radio transceivers and reduces adjacent channel interference caused by transmitters in fixed, base station type transceivers. For a given transmit power, the present invention reduces decoding complexity and therefore reduces battery drain by the receiver or improves decoding performance in terms of reducing the number of bit errors without increasing battery drain by the receiver.

Two further example applications of the present invention are briefly described. First, multiple diversity transmitting antennas (see antennas 28a . . . 28n) may be used to transmit the same information to the receiver to improve signal quality. For example, the antenna having the better path to the receiver can be selected by the receiver based on the received signal on each antenna. Transmission along a better path offers better signal quality, and hence, a lower value of M can be employed.

A second further example application of the present invention relates to symbol interleaving and/or frequency hopping. Interleaving is used to "break-up" channel memory. If a sequence of symbols is sent and the symbols are highly correlated in time due to channel memory, decoding performance will be poor whenever the channel condition is poor because all symbols are affected. However, if the symbols are "shuffled" such that they are separated by other unrelated symbols, they are less likely to be equally affected by channel memory. Symbol interleaving when used with frequency hopping is particularly effective in improving signal quality because, in addition to separating symbols in time, those symbols are also separated in frequency. Groups of time-separated symbols are transmitted at different carrier frequencies. At the receiver, the symbols are suitably deinterleaved and sent to the variable M-algorithm for decoding. The improved signal quality due to interleaving (in both time and frequency) allows the use of a low value of M.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims. For example, although the present invention is described in terms of post-detection diversity where the buffered samples were selected after the signals from the diversity antennas were demodulated to baseband, the signal selection could be performed using predetection/demodulation diversity, i.e., at RF or IF frequencies. Although the invention is described for trellis coded modulation, it can be used in demodulating block coded modulation, convolutional codes, block codes, partial response modulation such as continuous phase modulation and any set of signals that can be represented by a trellis.

What is claimed is:

1. In a communications system, a method for decoding encoded symbols transmitted over a communications channel, comprising the steps of:
   (a) developing a trellis structure of nodes and branches for decoding a sequence of symbols received on the communications channel, each set of nodes in the trellis corresponding to a fixed number of states representing possible values of a received symbol at one time instant, each branch defining a specific transition between nodes at different time instants and having an associated branch weight, wherein a linkage of branches between nodes in the trellis defines a path through the trellis that represents a possible symbol sequence;
   (b) determining a current condition of the communications system;
   (c) determining a variable number of survivor paths through the trellis, wherein the determined value of the variable number of survivor paths varies depending on the determined condition of the communications system determined in step (b) and is less than the fixed number of states in the trellis when the current communications system condition meets a predetermined condition; and
   (d) decoding the sequence of received symbols using the determined number of survivor paths.

2. The method in claim 1, step c including:
   selecting a first value for the variable number of survivor paths if the current communications system condition is greater than or equal to a threshold, and
   selecting a second value for the variable number of survivor paths greater than the first value of the variable number of survivor paths if the current status of the communications system condition is less than the threshold.

3. The method in claim 1, step (c) including:
   increasing the value of the variable number of survivor paths if the current condition is less than the threshold up toward the fixed number of states in the trellis, and
   decreasing the value of the variable number of survivor paths if the current condition is greater than or equal to the threshold.

4. The method in claim 3, wherein after decreasing the value of the variable number of survivor paths and the current quality of the channel drops to less than the threshold, repeating steps (c) and (d) for the received sequence of symbols using an increased value for the variable number of survivor paths.

5. The method in claim 1, wherein the condition is a quality of the communications channel, said determining step (b) including:
   detecting the current quality of the communications channel,
   selecting a first value for the variable number of survivor paths if the current quality of the communications channel is greater than or equal to a threshold, and
   selecting a second value for the variable number of survivor paths greater than the first value if the current quality of the communications channel is less than the threshold.

6. The method in claim 5, wherein the current quality of the communications channel is determined based on a signal strength of the received signal.

7. The method in claim 6, wherein the communications channel is a fading channel and the signal strength corresponds to an average faded signal amplitude of the received signal.

8. The method in claim 1, wherein the condition is a size of a coding memory of an encoding scheme used to encode symbols to be transmitted, step (c) including adjusting the value of the variable number of survivor paths to decode symbols encoded using an encoding scheme based on the size of the coding memory.

9. The method in claim 1, wherein steps (a)–(d) are performed using data processing circuitry, the data processing circuitry performing additional other tasks in time-shared fashion, and wherein the condition is current data processing tasks to be performed by the data processing circuitry, step (c) including:
   decreasing the value of the variable number of survivor paths if a current number of the additional other tasks to be performed is relatively large, and
   increasing the value of the variable number of survivor paths if the current number of additional other tasks to be performed is relatively small.

10. The method in claim 1, wherein the communications system includes a portable, battery-operated receiver and steps (a)–(d) are performed using data processing circuitry, and wherein the condition is a quality of the communications channel, step (c) including:
    decreasing the value of the variable number of survivor paths if the quality of the communications channel equals or exceeds a threshold to reduce battery drain, and increasing the value of the variable number of survivor paths if the quality of the communications channel is less than said threshold to improve decoding performance.

11. The method in claim 1, further comprising:
    receiving a number of signals including encoded sequences of symbols transmitted from plural users on the communications channel at a single receiver, wherein the condition is the number of signals;
    increasing the value of the variable number of survivor paths for a relatively large number of received signals; and
    decreasing the value of the variable number of survivor paths for a relatively small number of received signals.

12. The method in claim 5, wherein the first value corresponds to a minimum value of the variable number of survivor paths and the second value corresponds to a maximum value, and wherein after selecting the minimum value and the current quality of the channel drops to less than the threshold, increasing the value of the variable number of survivor paths in a controlled fashion.

13. The method in claim 12, wherein after increasing the value of the variable number of survivor paths and the current quality of the channel improves to greater than the threshold, maintaining the value of the variable number of survivor paths for one or more symbol periods before determining whether to decrease the value of the variable number of survivor paths.

14. The method in claim 13, wherein after the one or more symbol periods, the value of the variable number of survivor paths is halved in successive stages of the trellis to a minimum value while the current condition of the communications channel continues to equal or exceed the threshold.

15. A communications system, comprising:
a transmitter having an encoder for trellis encoding a sequence of symbols and transmitting the trellis encoded symbols over a communications channel;
a receiver for receiving the trellis encoded symbols transmitted over the communications channel and having a trellis decoder including electronic circuitry for performing the steps of:
(a) developing a trellis structure of nodes and branches for decoding a sequence of symbols received on the communications channel, each set of nodes in the trellis corresponding to a fixed number of states representing possible values of a received symbol at one time instant, each branch defining a specific transition between nodes at different time instants and having an associated branch weight, wherein a linkage of branches between nodes in the trellis defines a path through the trellis that represents a possible symbol sequence;
(b) determining a current condition of the communications system;
(c) determining a variable number of survivor paths through the trellis, wherein the value of the variable number of survivor paths depends on the condition of the communications system determined in step (b) and may differ from the fixed number of states in the trellis and wherein the value of the variable number of survivor paths is less than the fixed number of states in the trellis when the condition of the communication system satisfies a predetermined condition; and
(d) decoding the sequence of received symbols using the the variable number of survivor paths survivor paths.

16. The system in claim 15, wherein the condition is a quality of the communications channel and the electronic circuitry detects the current quality of the communications channel, selects a first value for the variable number of survivor paths if the current quality of the communications channel is greater than or equal to a threshold, and selects a second value for the variable number of survivor paths greater than the first value if the current quality of the communications channel is less than the threshold.

17. The system in claim 15, wherein the electronic circuitry increases the value of the variable number of survivor paths if the current condition is less than a threshold, and decreases the value of the variable number of survivor paths if the current condition is greater than or equal to the threshold.

18. The system in claim 17, wherein after decreasing the value of the variable number of survivor paths and the current quality of the channel drops to less than the threshold, the electronic circuitry repeats steps (c) and (d) for the received sequence of symbols using an increased value of the variable number of survivor paths.

19. The system in claim 18, wherein after increasing the value of the variable number of survivor paths and the current quality of the channel improves to greater than the threshold, the electronic circuitry maintains the value of the variable number of survivor paths at its current value for one or more symbol periods before determining whether to decrease the value of the variable number of survivor paths.

20. The system in claim 19, wherein after the one or more symbol periods, the electronic circuitry halves the value of the variable number of survivor paths in successive stages of the trellis to a minimum value while the current condition of the communications channel continues to equal or exceed the threshold.

21. The system in claim 15, wherein the condition is a size of a coding memory of an encoding scheme used to encode symbols to be transmitted, step (c) including adjusting the value of the variable number of survivor paths to decode symbols encoded using an encoding scheme based on the size of the coding memory.

22. The system in claim 15, wherein said electronic circuitry performs additional tasks other than tasks related to performing steps (a)–(d) in time share fashion, and wherein the condition is current data processing tasks to be performed by the electronic circuitry, the electronic circuitry decreasing the value of the variable number of survivor paths if a current number of the additional other tasks to be performed is relatively large, and increasing the value of the variable number of survivor paths if the current number of additional other tasks to be performed is relatively small.

23. The system in claim 15, wherein the receiver includes a battery for portable battery operation and the electronic circuitry performs additional tasks other than tasks related to performing steps (a)–(d) and the condition is current data processing tasks to be performed by the electronic circuitry, the electronic circuitry decreasing the value of the variable number of survivor paths if a current number of total tasks to be performed is relatively large to decrease power required by the electronic circuitry, and increasing the value of the variable number of survivor paths if the current number of total tasks to be performed is relatively small.

24. The system in claim 15, further comprising plural transmitters, wherein the receiver receives a number of signals including encoded sequences of symbols transmitted from the plural transmitters on the communications channel, wherein the condition is the number of signals;
increasing the value of the variable number of survivor paths for a first number of received signals; and
decreasing the value of the variable number of survivor paths for a second number of received signals smaller than the first number.

25. In a communications system, a method for decoding encoded symbols transmitted over a communications channel, comprising the steps of:
(a) developing a trellis structure of nodes and branches for decoding a sequence of symbols received on the communications channel, each set of nodes in the trellis corresponding to a fixed number of states representing possible values of a received symbol at one time instant, each branch defining a specific transition between nodes of nodes sets at different time instants and having an associated branch weight, wherein a linkage of branches between nodes in the trellis defines a path through the trellis that represents a possible symbol sequence;

(b) determining a quality of the communications channel;
(c) comparing the channel quality to a threshold;
(d) determining a variable number of survivor paths through the trellis,
(e) if the compared channel quality equals or exceeds the threshold, setting the value of the variable number of survivor paths to a small value less than the number of fixed states in the trellis, and
(f) performing a trellis decoding stage of the sequence of received symbols using only the smaller value of survivor paths, and returning to step (b)
if the compared channel quality is less than the threshold, setting the value of M to a larger value and performing one or more stages of trellis decoding before returning to step (c).

26. The method in claim 25, (e) further comprises:
retracing a preset number of stages in the trellis and performing trellis decoding with an increased value of the variable number of survivor paths.

27. The method in claim 26, further comprising:
after retracing, checking whether the current channel quality is less than the threshold; and
if the current channel quality is less than the threshold after performing the predetermined number of stages of trellis decoding, performing a next predetermined number of stages of trellis decoding in a further increased value of the variable number of survivor paths.

28. The method in claim 25, wherein if after setting the value for the variable number of survivor paths to the relatively large value, a current channel quality is determined to be greater than or equal to the threshold for a predetermined number of trellis decoding stages, setting a new value for the variable number of survivor paths less than the relatively large value.

29. The method in claim 28, wherein the new value is set to the larger of the relatively large value of the variable number of survivor paths divided by 2 and a minimum value of the variable number of survivor paths.

30. The method in claim 25, wherein the current quality of the communications channel is determined based on a signal strength of the received signal.

31. The method in claim 25, wherein the communications channel is a fading channel and the signal strength corresponds to an average faded signal strength of the received signal.

32. The method in claim 25, wherein the communications channel is slotted and the sequence of encoded symbols is divided into portions with different portions being interleaved into different slots on the communications channel before transmission, and wherein before step (a), the method includes deinterleaving the received sequence of symbols.

33. In a communications system, a method for decoding in a radio receiver encoded symbols transmitted over a communications channel, the radio receiver having plural antennas for receiving a transmitted signal including a sequence of coded symbols, comprising trellis decoding the received signal using a variable number of survivor paths of trellis survivor paths that differs from a fixed number of states in the trellis where the variable number of survivor paths is reduced by selecting a received signal from one of the plural antennas having a highest signal quality thereby reducing the complexity of the trellis decoding procedure.

34. The method in claim 33, further comprising:
detecting and storing signals received from each of the plural antennas;
determining a channel quality indicator for each stored signal;
selecting the stored signal with the highest channel quality indicator.

35. The method in claim 34, further comprising:
decreasing the value of the variable number of survivor paths if the highest signal quality is greater than or equal to a threshold, and
increasing the value of the variable number of survivor paths if the highest signal quality is less than the threshold.

36. The method in claim 34, further comprising:
selecting a first value for the variable number of survivor paths if a current highest signal quality is greater than or equal to a threshold, and
selecting a second value for the variable number of survivor paths greater than the first value if the current highest signal quality is less than the threshold.

37. The method in claim 36, wherein signal quality is determined based on a signal strength of the received signal.

38. The method in claim 33, further comprising:
(a) developing a trellis structure of nodes and branches for decoding the sequence of symbols received on the communications channel, each set of nodes in the trellis representing possible values of a received symbol at one time instant, each branch defining a specific transition between nodes at different time instants and having an associated branch weight, wherein a linkage of branches between nodes in the trellis defines a path through the trellis that represents a possible symbol sequence;
(b) accumulating for each trellis path an accumulated weight; and
(c) determining the the variable number of survivor paths survivor paths through the trellis based on respective accumulated path weights for each trellis path.

39. A communications system, comprising:
a transmitter having an encoder for trellis encoding a sequence of symbols and transmitting the trellis encoded symbols over a communications channel; and
a receiver having plural antennas for receiving transmitted signals including a sequence of trellis-encoded symbols transmitted over the communications channel and a trellis decoder including electronic circuitry that trellis-decodes a received signal using a variable number of trellis survivor paths that may differ from a fixed number of states in the trellis and optimally varies the variable number of survivor paths by selecting the received signal from one of the plural antennas having a highest signal quality to reduce the complexity of the trellis decoding procedure.

40. The communications system in claim 39, wherein the signal quality is determined based on a signal strength of the received signal.

41. The communications system in claim 39, wherein the receiver determines a current signal quality condition of the communications channel for signals received by each of the antennas and the trellis decoder varies the variable number of survivor paths based on the determined current signal quality condition for the selected received signal.

42. The communications system in claim 41, wherein the trellis decoder decreases the variable number of survivor paths if the signal quality is greater than or equal to a threshold, and increases the variable number of survivor paths if the signal quality is less than the threshold.

43. In a communications system, a method for decoding in a receiver encoded symbols transmitted over a communications channel, the receiver having plural antennas for receiving a transmitted signal including a sequence of coded symbols, comprising trellis decoding the received signal using a variable number of trellis survivor paths where the variable number of survivor paths is optimally varied by selectively weighting and then combining the received signals from the plural antennas to generate a combined signal such that a received signal having the best signal quality is the most heavily weighted in the combination, wherein the use of the variable number of survivor paths reduces the complexity of the trellis decoding procedure.

44. The method in claim 43, further comprising:

decreasing the value of the variable number of survivor paths if an overall signal quality of the combined signal is greater than or equal to a threshold, and increasing the value of the variable number of survivor paths if the highest signal quality is less than the threshold.

45. The method in claim 43, further comprising:

selecting a first value for the variable number of survivor paths if an overall signal quality of the combined signal is greater than or equal to a threshold, and selecting a second value for the variable number of survivor paths greater than the first value if the overall signal quality of the combined signal is less than the threshold.

46. In a communications system, a method comprising:

encoding a sequence of symbols;

separating portions of the sequence of encoded symbols in time or frequency;

transmitting the separated portions;

receiving the separated portions and combining the separated portions into the sequence of symbols; and trellis decoding the received signal using a variable number of trellis survivor paths where the variable number of survivor paths used in the trellis decoding is reduced as a result of the separating step.

47. The method in claim 46, wherein the separating step includes separating the portions in both time and frequency.

* * * * *